United States Patent [19]

Hooper et al.

[11] Patent Number: 5,452,226
[45] Date of Patent: Sep. 19, 1995

[54] RULE STRUCTURE FOR INSERTION OF NEW ELEMENTS IN A CIRCUIT DESIGN SYNTHESIS PROCEDURE

[75] Inventors: Donald F. Hooper, Northboro; Snehamay Kundu, Marlboro, both of Mass.

[73] Assignee: Digital Equipment Corporation, Maynard, Mass.

[21] Appl. No.: 703,706

[22] Filed: May 21, 1991

Related U.S. Application Data

[63] Continuation of Ser. No. 391,671, Aug. 7, 1989, abandoned, which is a continuation of Ser. No. 907,513, Sep. 12, 1986, abandoned.

[51] Int. Cl.$^6$ ............................................. G06F 17/50
[52] U.S. Cl. ..................................... 364/489; 364/488
[58] Field of Search ............... 364/488, 489, 490, 491; 395/921

[56] References Cited

U.S. PATENT DOCUMENTS

| | | | |
|---|---|---|---|
| T. 935,003 | 6/1975 | Linville et al. | 364/490 |
| 4,377,849 | 3/1983 | Finger et al. | 364/491 |
| 4,386,403 | 5/1983 | Hsieh et al. | 364/300 |
| 4,441,207 | 4/1984 | Lougheed et al. | 364/490 |
| 4,584,653 | 4/1986 | Chih et al. | 364/488 |
| 4,613,940 | 9/1986 | Stenton et al. | 364/488 |
| 4,635,208 | 1/1987 | Coleby et al. | 364/491 |
| 4,651,284 | 3/1987 | Watanabe et al. | 364/491 |
| 4,700,317 | 10/1987 | Watanabe et al. | 364/488 |
| 4,706,187 | 11/1987 | Arai et al. | 364/491 |

FOREIGN PATENT DOCUMENTS

| | | | |
|---|---|---|---|
| 0168650 | 1/1986 | European Pat. Off. | 364/489 |
| 1445914 | 8/1976 | United Kingdom | 364/490 |

OTHER PUBLICATIONS

"A Design Verification and Logic Validation System" by W. A. Noon, IEEE Design Automation Conference, 1977, pp. 362–368.

"Autodraft: Automatic Synthesis of Circuit Schematics" by Majewski et al., IEEE International Conf. on Computer-Aided Design, 1986, pp. 435–438.

"An Expert System for the Generation of Schematics" by Ahlstrom et al., IEEE ICCD, 1984, pp. 720–725.

"The ADAM Advanced Design Automation System: Overview, Planner and Natural Language Interface" by Granacki et al., 22nd ACM/IEEE Design Automation Conf., 1985, pp. 727–730.

"RCAD—A Rule-Based System for CAD" by N. Anand, Computing Technology, TI Technical Journal, May–Jun. 1990, pp. 16–25.

"Kinden: Knowledge-based Intelligent VLSI Design Environment" by Hekmatpour et al; Proc. 5th Annual AI System in Gov'5 Conf., May 1990, pp. 96–103.

(List continued on next page.)

*Primary Examiner*—Vincent N. Trans
*Attorney, Agent, or Firm*—Kenneth F. Kozik

[57] ABSTRACT

In the synthesis procedure for circuit design, a convenient notation is used for the insertion of new instances in the consequence portion of a rule having a antecedent form and a consequence portion. The notation is of the form (outputs . . . )=(operator inputs . . . ).

The outputs and inputs may be signal names or data base pin access forms. Double quoted strings of characters can represent specific signals in the global design model. Double quoted strings of characters including the % character can be used for local connectivity among logic elements representing multiple equations inserted by the rule. The equations are converted to model instance structures and are inserted into the data base. Creation of database pointers are generated automatically and not by the rule writer, greatly simplifying the rule syntax.

46 Claims, 11 Drawing Sheets

OTHER PUBLICATIONS

"Databases and Cell-Selection Algorithms for VLSI Cell Libraries" by S. Y. Foo, IEEE—Computer, 1990, pp. 18–29.

"VHDL in an Object Oriented VLSI Design Environment" by Cheng et al., 33rd IEEE Computers Society Intl. Conf., Feb.–Mar. 1988, pp. 324–327.

Daniel et al., "CAD Systems for IC Design", IEEE Computer-Aided Design of Integrated Circuits and Systems, vol. CAD-1, No. 1, Jan. 1982, pp. 2–11.

Trimberger, "Automating Chip Layout", IEEE Spectrum, vol. 19, No. 6, Jun. 1982, pp. 38–45.

Franco et al., "The Cell Design System", IEEE 18th Design Automation Conference, paper 12.4, 1981, pp. 240–247.

Kessler et al., "Standard Cell VLSI Design: A Tutorial", IEEE Circuit and Devices Magazine, Jan. 1985, pp. 17–34.

T. Uehara, "A Knowledge-Based Logic Design," IEEE Design & Test of Computers, vol. 2, No. 5, pp. 27–34 (Oct. 1985).

K. Lieberherr, "Toward a Standard Hardware Description Language," IEEE Design & Test of Computers, vol. 2, No. 1, pp. 55–62 (Feb. 1985).

Randy H. Katz, 'Managing the Chip Design Database', IEEE Computer, vol. 16, No. 12, Dec. 1983, pp. 26–35.

Guy L. Steele, Jr., 'Common LISP: The Language' The Digital Press, Maynard, Mass., 1984 (Table of Contents).

RULE STRUCTURE FOR INSERTION OF NEW ELEMENTS IN A CIRCUIT DESIGN SYNTHESIS PROCEDURE

This application is a continuation, of application Ser. No. 07/391,671, filed Aug. 7, 1989, which is a continuation of application Ser. No. 06/907,513 filed Sep. 12, 1986 now abandoned.

RELATED PUBLICATIONS

The following publications and U.S. Patent Applications are related documents to the instant Application:

Managing the Chip Design Database, by Randy H. Katz, IEEE Computer, Vol. 16, No. 12, December 1983, pages 26 through 35.

Common LISP: The Language, by Guy L. Steele Jr, 1984, The Digital Press, Maynard, Mass., U.S.A.

Rule Structure in a Procedure for Synthesis of Logic Circuit Designs, invented by Donald F. Hooper et al., assigned to the same assignee named herein, having U.S. Ser. No. 907,512, filed Sep. 12, 1986.

Procedure and Data Structures for Synthesis and Transformation of Logic Circuit Designs, invented by Donald F. Hooper et al., assigned to the same assignee named herein, having U.S. Ser. No. 907,303, filed Sep. 12, 1986.

Data Base Access Mechanism for Rules Utilized by a Synthesis Procedure for Logic Circuit Design, invented by Donald F. Hooper, assigned to the same assignee named herein, having U.S. Ser. No. 907,515, filed Sep. 12, 1986.

Bitwise Implementation Mechanism for a Circuit Design Synthesis Procedure, invented by Donald Hooper et al., assigned to the assignee named herein, having Ser. No. 907,516, filed Sep. 12, 1986.

BACKGROUND OF THE INVENTION

1. Field of the Invention

This invention relates generally to the synthesis of circuit designs and more particularly to a mechanism in the synthesis procedure that permits the insertion of elements into the circuit design.

2. Description of the Related Art

Many hardware description languages allow for simple textual description of logic design connectivity. These languages typically use infix notation for generic boolean and arithmetic operators and have an unordered pin/signal format for complex structures.

Referring next to FIG. 1, the procedure for synthesizing a logic circuit design according to the prior art is shown. Model definition data structures from a library of component definitions are entered into the data structures associated with the synthesis data base in step 11. In step 12, the information related to the instances of the circuit design, including the connectivity information, is entered in the data base. The instances of the circuit design are generally in a behavioral or functional form when entered in the synthesis data base. The synthesis procedure relates the instances of the circuit design to the model instances in step 13. In step 14, a set of rules for the synthesis procedure is applied to each of the model instances and the model instances are altered and connected in such a way as to maximize certain parameters such as size, path delay, power, etc. In step 15, the resulting circuit design is placed in a format that can control the automated fabrication of the circuit.

FEATURES OF THE INVENTION

It is an object of the present invention to provide an improved procedure for the synthesis of circuit designs.

It is a feature of the present invention to provide a mechanism for insertion of model structures into a circuit design.

SUMMARY OF THE INVENTION

The aforementioned and other features are obtained, according to the present invention, by providing, in a circuit design synthesis procedure, a format in the rule structure that permits the insertion of model instances into the circuit design with a manner that is easy to use but permits insertion of complex models. The basic equation has the form <output-form>=(<model-name> <input-form> <input-form >... ). Common signal names in different rules imply that the signals are coupled. A special character (%), associated with a character string, is interpreted as a local signal. Input and output pins are ordered according to position relative to the representation of the model instance.

These and other features of the present invention will be understood upon reading of the following description along with the drawings.

DESCRIPTION OF THE PREFERRED EMBODIMENT

1. Detailed Description of the Figures

Figure 1:
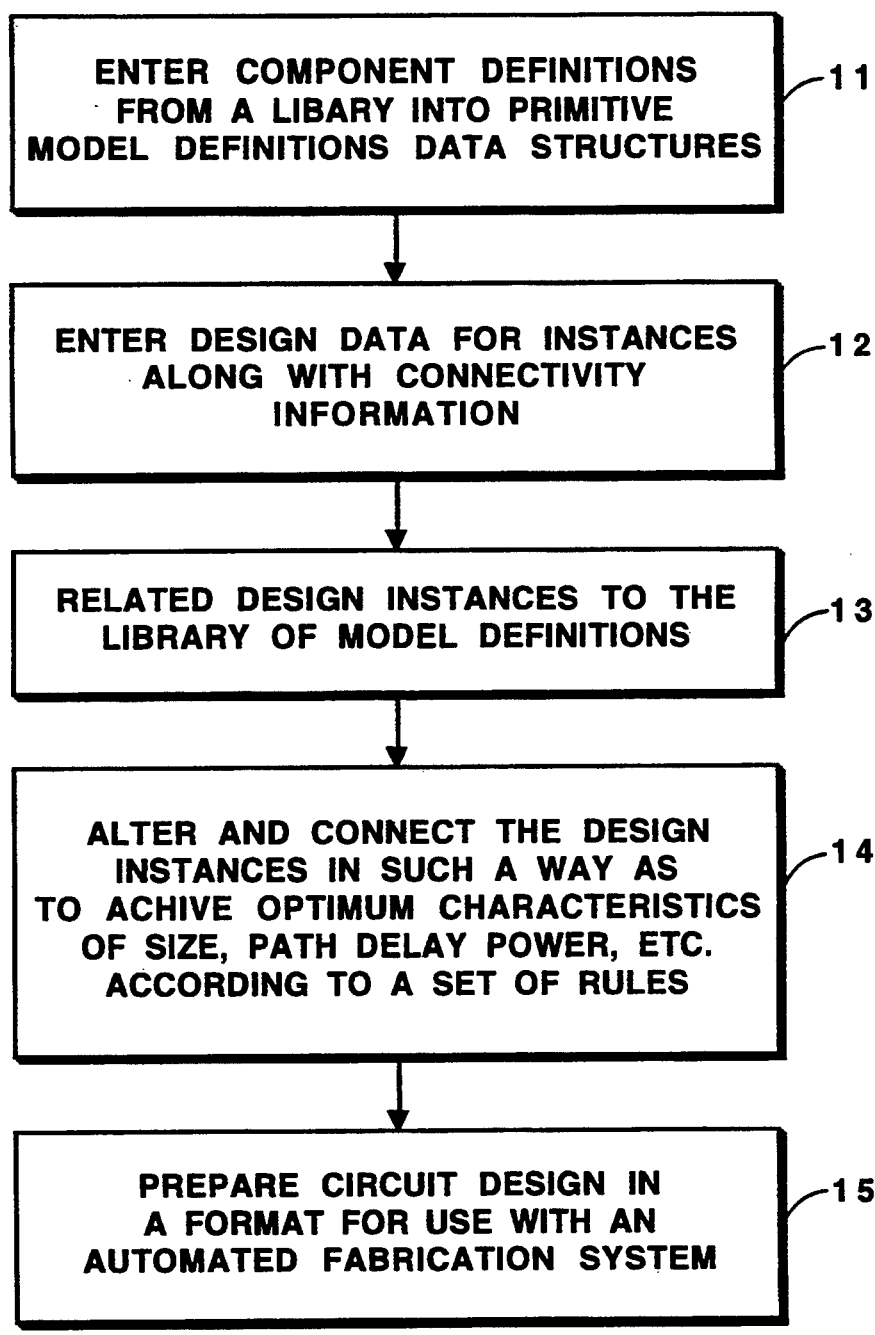
FIG. 1 is a flow diagram illustrating a procedure for synthesizing circuit designs according to the related art.

FIG. 1 has been described with relationship to the related art.

Figure 2:
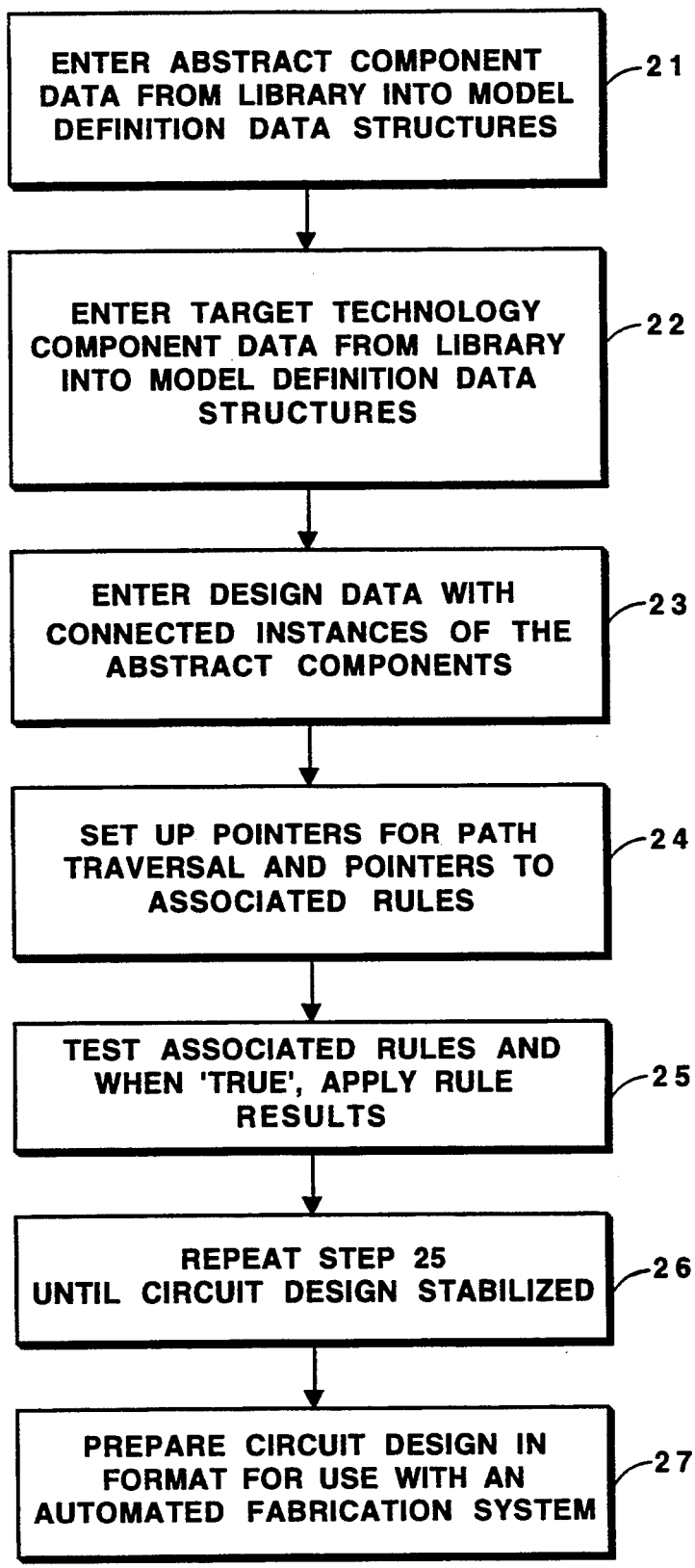
FIG. 2 is a flow diagram illustrating a procedure for synthesizing circuit designs with which the present invention is intended to be used.

Referring next to FIG. 2, the synthesis procedure of the present invention is shown. In step 21, abstract component data, from a library of such data, is entered into model definition data structures of the synthesis procedure. In step 22, component data from the LIBRARY relating to the target technology is entered into model definition data structures of the synthesis procedure. The circuit design data, with the connected instances described in terms of abstract components, is entered into the synthesis procedure in step 23. In step 24, the synthesis procedure provides two sets of pointers. The first set of pointers permits the synthesis procedure to follow any arbitrary path through the design circuit. The second set of pointers couples rules with associated data base structures. In step 25, the associated rules are tested for each instance and when the test provides a 'true' result, the consequent portion of the rule is implemented. In the preferred embodiment, each rule has an antecedent portion and a consequence portion. The antecedent portion includes a test algorithm, and the consequence portion provides the information required to implement a result of the test. Because the rules are applied to instances in a sequential manner, and because in the preferred embodiment the test procedures can involve neighboring instances that are changed as a result of a test applied to that instance, the process is repeated until the circuit design has stabilized, as shown in step 26. In step 27, the final version of the circuit design is placed in a format suitable for use in an automated circuit fabrication system.

Figure 3:
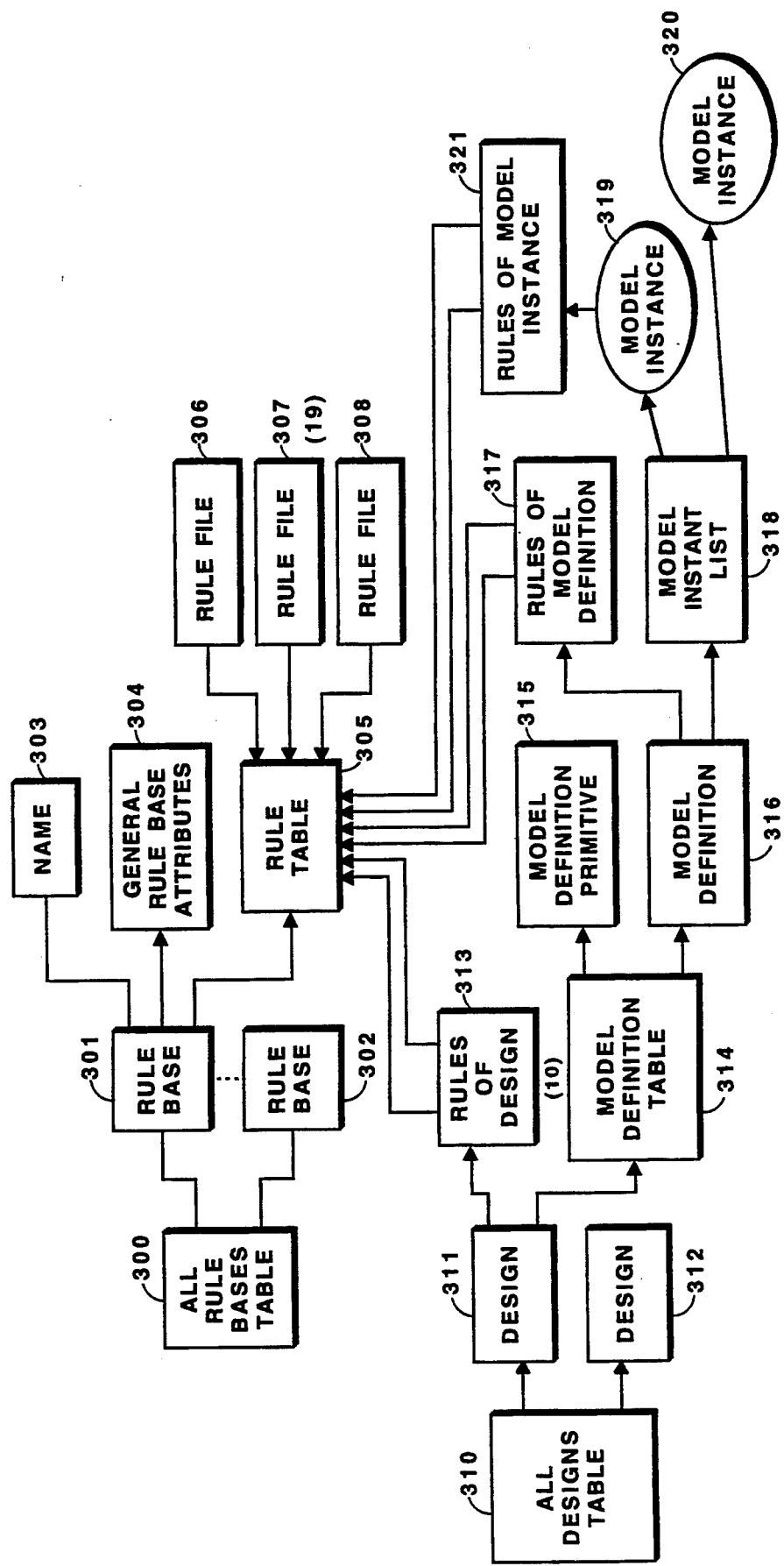
FIG. 3 is an overall diagram of the architecture for data structures of logic design and logic synthesis rules.

Referring now to FIG. 3, the architectural organization for the storage of the logic synthesis rules and the logic design rules are shown. Two storage hierarchies are available, one representing rule information and the second representing digital design information. These information hierarchies interact when pointers are established, relating the design objects to specific groups of rules. A rule file 306 through 308 is a collection of rules arbitrarily organized by the creator of the file. Several rule files can be transferred to a rule table 305. The rule table 305 is a lookup table that is indexed by the name of the rules stored therein. The rule table 305 is an attribute of a rule base 301 that has in addition to the rules stored in rule table 305, a name 303 and other attributes 304 of the rule base. Any number of rule bases 301 through 302 are contained in the table of all rule bases 300. The all rule bases table 300 is a lookup table indexed by the name of the rule base. The all rule base table 300 is the top of the rule information hierarchy. The logic design data is partitioned into blocks, called model definitions 315 through 316. Any number of model definitions can be stored in the model definition table 314, a lookup table indexed by the model name. A model definition can contain a model instance list 318 that includes model instances 319 and 320 that are model instances of other model definitions. For any functional part type or structural body of a given name, only one model definition can exist. However, any functional part type or structural body can have zero or more model instances. The attributes of the model definition are common to all of the instances associated therewith and, therefore need to be stored only with the model definition. The model definition contains "LIBRARY" information. The attributes of the model instances, such as timing parameters and simulation values are unique to each model instance and, consequently must be stored with the associated instance. Those model definitions with no model instances or for which a "LIBRARY" attribute is specified are considered primitive model definitions and are stored in table 315. The model definition table 314 is stored in a design table 311, the design table capable of possessing other attributes. Any number of designs 311 through 312 can be contained in the all designs table 310.

Figure 4:
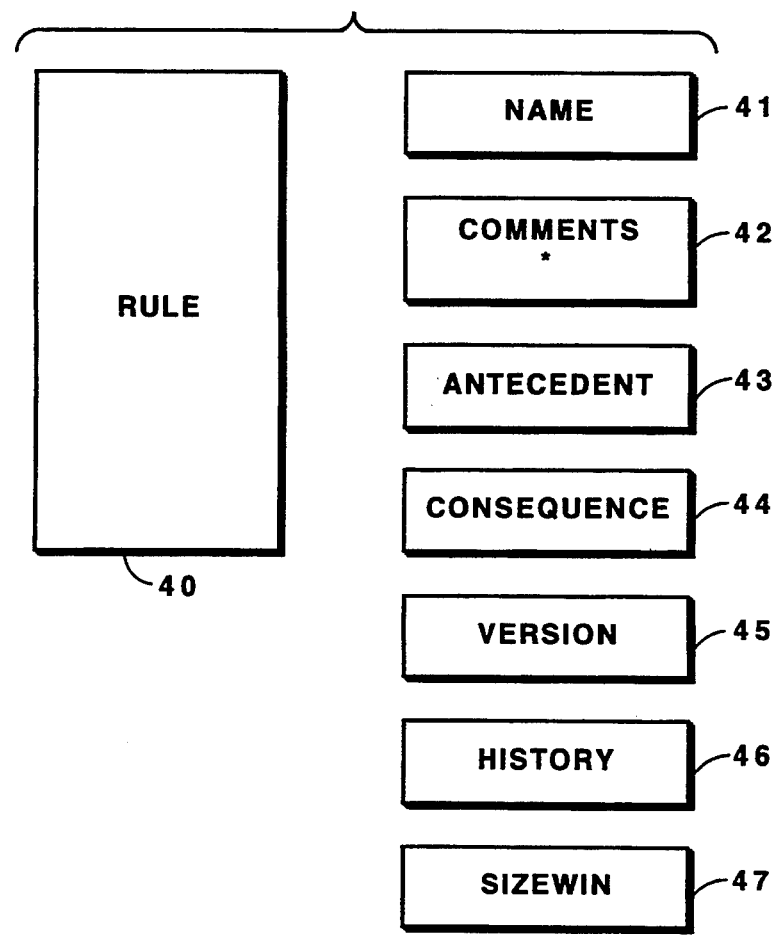
FIG. 4 is an illustration of the structure of a rule file according to the present invention.

Referring next to FIG. 4, the general structure of a rule 40 used in the logic network synthesis is shown. At rule file read time, the structure is created for each rule 40. A location in the file is reserved for the name field 41 of the rule. Another location is reserved for comments file 42 which contains formal comments concerning the use of the rule. Antecedent field 43, consequence field 44, version field 45, history field 46 and sizewin field 47 are fields within the rule structure. The antecedent field 43 and the consequence field 44 are described below. The version field 45 includes version information from a host computer aided design (CAD) data management system, when available, or time_of_day and date information when available. The history field 46 is initially set to zero and is subsequently used to keep a running count of the number of times the associated rule is applied.

Figure 5:
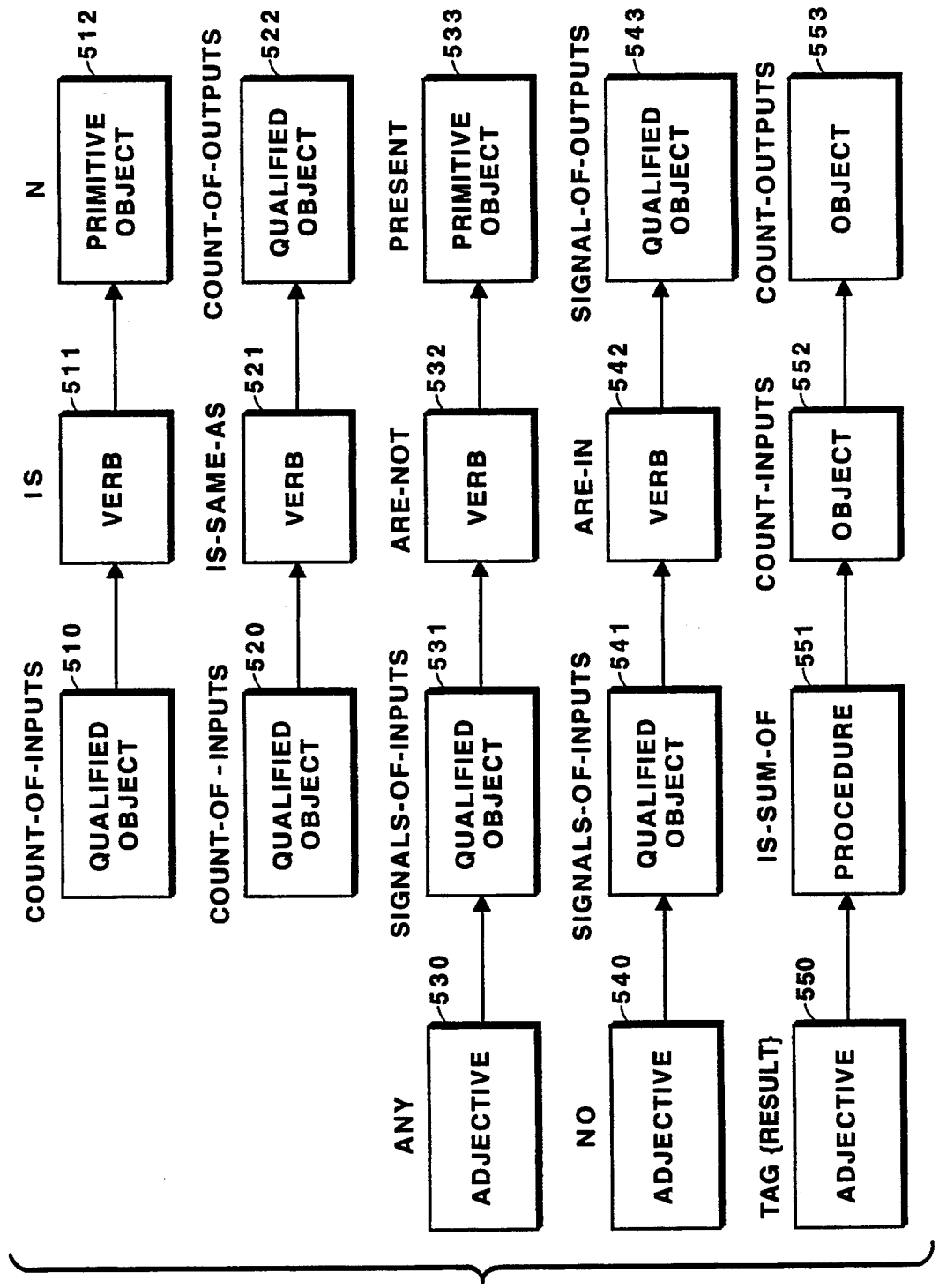
FIG. 5 illustrates the forms of the antecedent portion of the rule file according to the present invention.

Referring to FIG. 5, five examples of the antecedent field 43 of the rule structure 40 of FIG. 4 are shown. In these examples, a qualified object is a database object at the end of an access chain for which the beginning is a current instance. A qualified object may also be a plurality of qualified objects. A primitive is taken as is without further database access (A number is a primitive object. In the first example, (count_of_inputs is N), the qualified object 510 is followed by a verb 511 followed by a primitive object 512. If the current instance has N inputs, then this antecedent will return a 'true' (T) when evaluated, otherwise, the antecedent will return a 'nil' when evaluated. In the second example, (count_of_inputs is_same_as count_of_outputs) the qualified object 520 is followed by a verb 521 which in turn is followed by a qualified object 522. In the third example, (any signals_of_inputs are_not present), adjective 530 is followed by a qualified object 531, in turn followed by a verb 532, which in turn is followed by primitive object 533. This field is interpreted as follows. When any of the inputs of the current instance is not coupled to a signal, the antecedent will return a 'true' value. In example four, (no signals_of_inputs are_in signal_of_outputs), an adjective 540 is followed by a qualified object 541, in turn followed by a verb 542, which is in turn followed by a qualified object 543. In the fifth example, (tag{result} is_sum_of count_inputs count_outputs), a value{result} 550 is stored that is the result of of a called procedure 551 with an arbitrary number of arguments 552, 553 et al. This procedure call permits LISP functions to be used by a rule antecedent field. The arguments 552, 553 et al. can be primitive objects or qualified objects. The name{result} can be used during the remainder of the rule antecedent field procedure and consequence field procedures to fetch the value stored under that name. The number of tags is not limited and all tag storage is erased when the antecedent portion of the rule is false or at the completion of the consequence portion of the rule. This type of antecedent always returns a 'true' (T) value, regardless of the value of the tag field. In the preferred embodiment, it is possible to use keywords (tag1, tag2, etc.) and to refer to them directly as in the expressions:

(tag{result} is_sum_of count_inputs count_outputs)

({result} is_less_than N) which can also be expressed:

(tag1 is_sum_of count_inputs count_outputs) (tag1 is_less_than N.)

Rule antecedents can also be nested, by using the boolean terms 'AND' or 'OR'. This nesting can be done in LISP format. For example:

(or (count_ins is_less than N) ({result} is_less than N))

Figure 6:
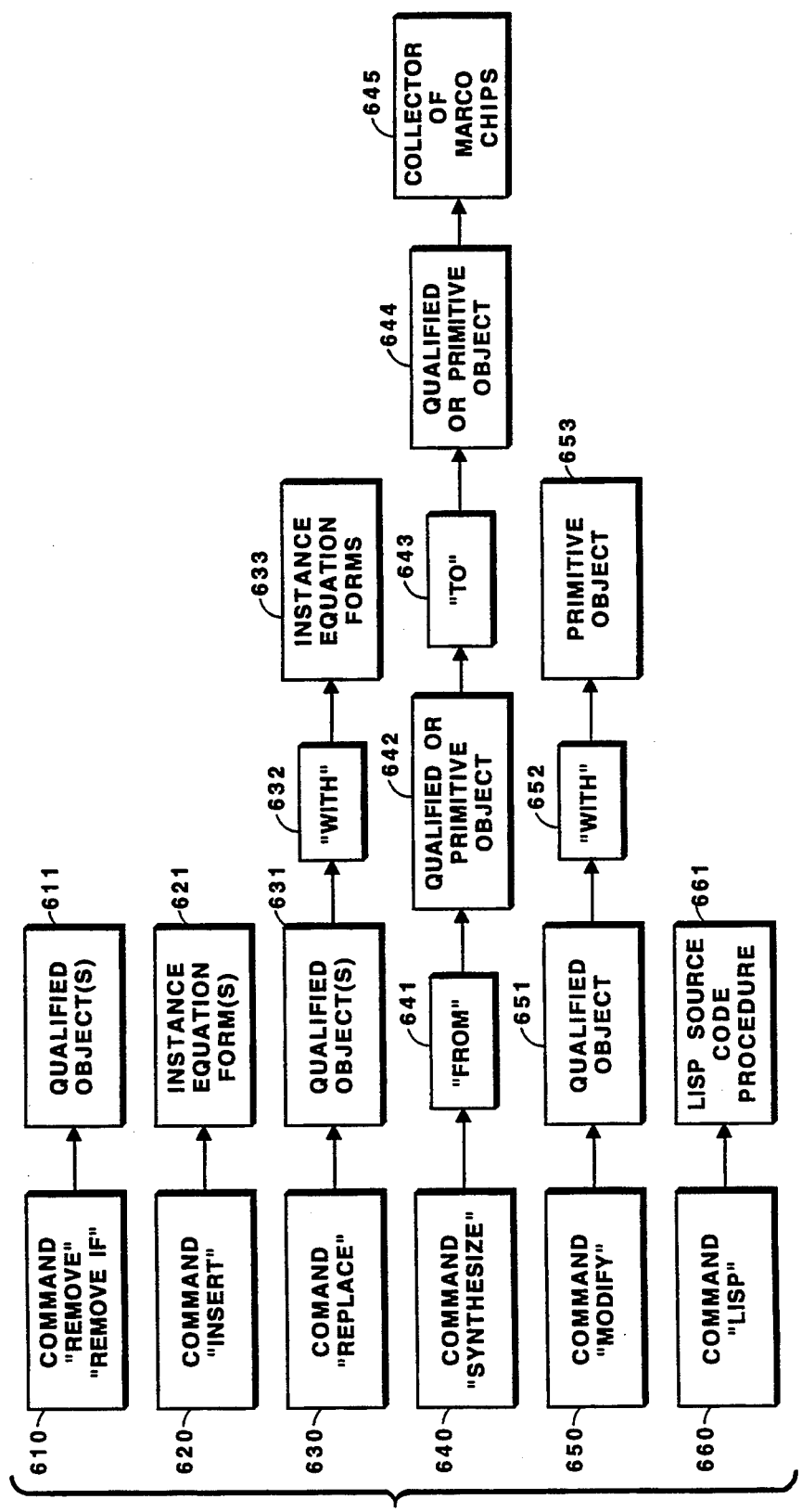
FIG. 6 illustrates the forms of the consequence portion of the rule file according to the present invention.

Referring next to FIG. 6, the structure of the consequence field of the rule 40 (FIG. 4) is illustrated by six examples. In the first example, the command 'remove' or 'remove_if' 610 is used to remove one or more instances 611 from the instances of the current model definition. In the second example of FIG. 6, the 'insert' command 620 is used to perform the reverse of the 'remove' command 610. The third example illustrates the 'replace' command 33. This command is combined with the 'remove' and the 'insert' command to remove one or more qualified model instance objects 631 and then to insert one or more model instance objects derived from equation form 633. The fourth example of FIG. 6 illustrates the form of the 'synthesize' command 640. This command is used for complex multibit synthesis in which the current instance operated upon by the rule has the attributes of most significant bit and least significant bit, as is common in high level specifications of digital designs. An example of such a device is a 32 bit incrementer, which can have a most significant bit of 31 and a least significant bit of 0. Following the 'synthesis' command is the keyword 'from' 641, followed by access to the most significant bit 642. The most significant bit 642 is followed by the keyword 'to', followed by access to the least significant bit 644 and finally followed by a collection of rules 645. This collection of rules is described in detail in the Patent Application entitled "Bitwise Implementation Mechanism for a Circuit Design Synthesis Procedure", identified above. The fifth example of FIG. 6 identifies the form of the 'modify' command 650. This command is used to alter a database object by setting its value. The 'modify' keyword is followed by a qualified object 651, the qualified object being followed by the by the keyword 'with' 652. The keyword 'with' is then followed by a primitive object 653. The sixth example of FIG. 6 uses the 'Lisp' keyword to permit entry of a LISP procedural expression 661. This procedural capability provides additional flexibility to modify the design database.

Figure 7:
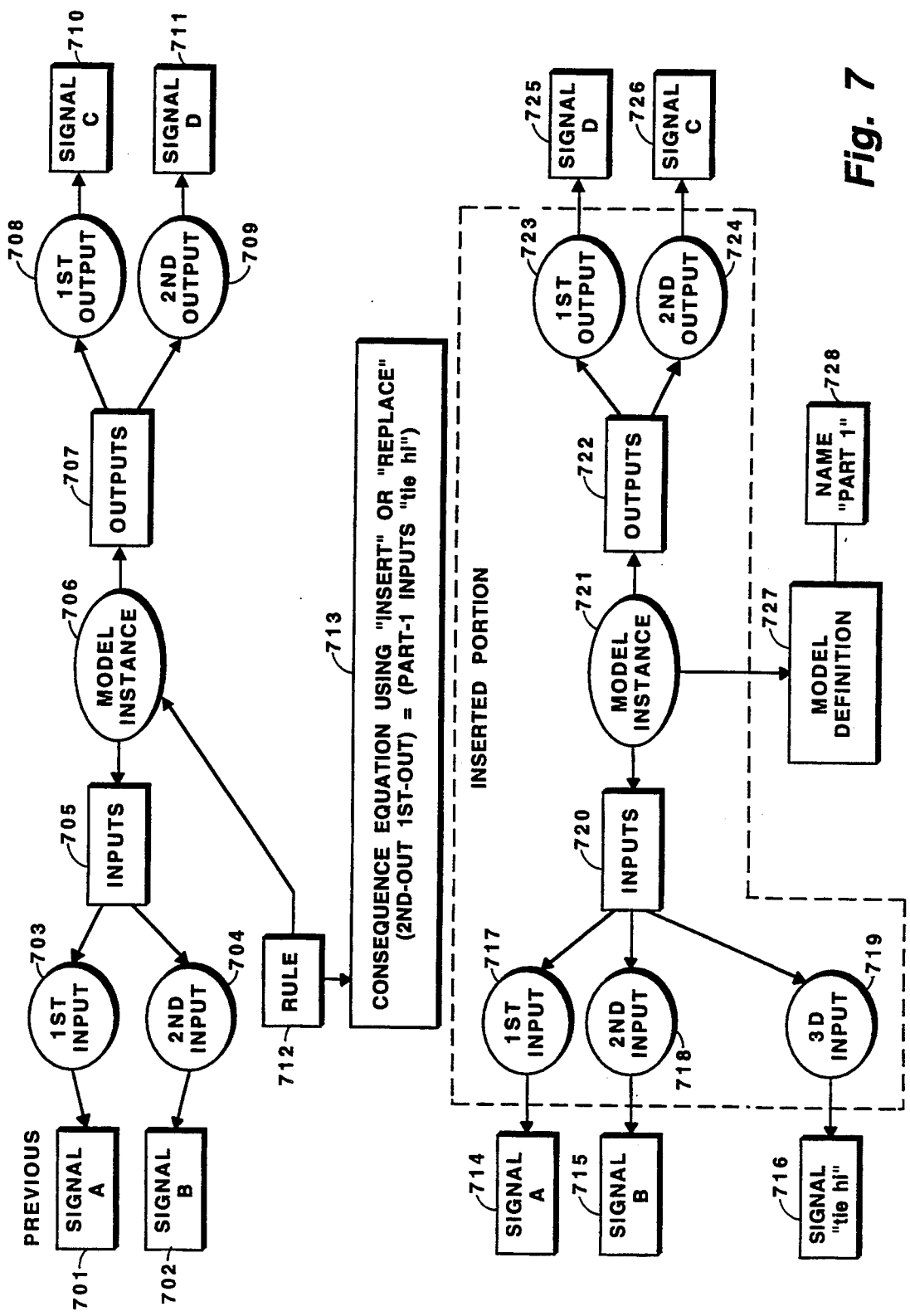
FIG. 7 illustrates the insertion of a logic model design instance in a circuit design by the rule structure of the synthesis procedure.

Referring now to FIG. 7, a rule 712 is applied against an instance 706. The consequence portion of the rule contains either an 'insert' or a 'replace' command followed by the equation statement 713. The "output" form of the equation statement refers to the second output 709 and first output 708 of the current model instance 706. The "inputs" form of the equation refers to the inputs 705, which are 703 and 704 of the current model instance. Signal A 701 is coupled to the first input 703, signal B 702 is coupled to the second input 704, signal C 710 is coupled to the first output 708 and signal D 711 is coupled to the second output 709. The equation is interpreted to cause creation of a new model instance 721 which is an instance of model definition 727 with the name "PART_1" 728. The new instance is given outputs 722, 723 and 724 with couplings to the signals D and C, 725 and 726, respectively. The order of the output signals has been reversed compared to the order of the current instances as required by the access ordering ('2nd-out', '1st-out') in the equation 713. The signals 725 and 726 are the same as signals 711 and 710, although the pointers to/from the new ports 723 and 724 have been added. The new instance is given an input group 720 with specific inputs 717 and 718 which have coupling to signals A and B, 714 and 715, respectively. Signals A and B are found by getting the signals 701 and 702 coupled to the inputs 703, 704 and 705 of model instance 706. An additional input form "tie_hi" is named in the equation 713. This additional name refers to a signal named "tie_hi" 716. This signal is found by the function 'find-signal' described below (i.e., in FIG. 11 and in FIG. 12). A third input 719 is created for this signal with the name "tie_hi". In this embodiment, the equation itself refers directly to the names of signals or the implied access of signals of the port instances (inputs, outputs) relative to a current instance. Moreover, one or more new instances are created with interfaces coupled to these same signals.

Figure 8:
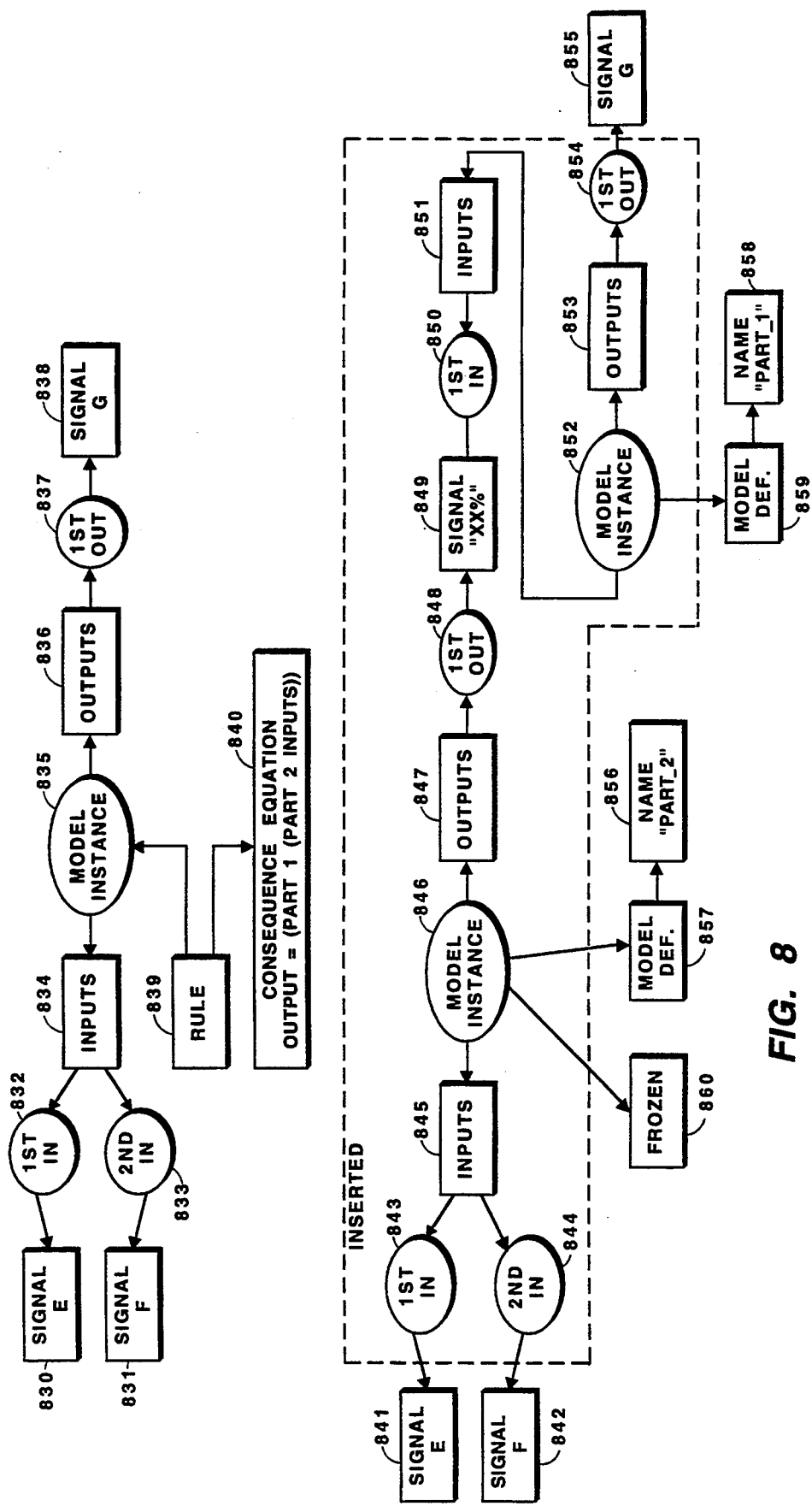
FIG. 8 illustrates the insertion of multiple logic design instances from a "nested" equation in a circuit design synthesis.

Referring next to FIG. 8, the insertion of a design from a "nested" equation is shown. A rule 839 is interpreted against a current model instance 835. The current model instance 835 has inputs 834, 832 and 833, and one output 836 and 837. The consequence equation 840 indicates insertion of a tree of parts, PART_1 fed by PART_2. The output form of the equation 'OUTPUT', refers to the output the signal 838 of outputs 838 of the current model instance 835. Also signal 738 is then coupled with the output of newly added parts for the access form 'OUTPUT' appearing on the left side of equation 840. The input access form of the equation 840 'INPUTS', implies the inputs of PARTS_2 are coupled to the signals 830 and 831 of the inputs of the current model instance. At insertion time, two model instances 846 and 852 are created. An internal signal 849 is generated for the coupling between the two model instances.

Figure 9:
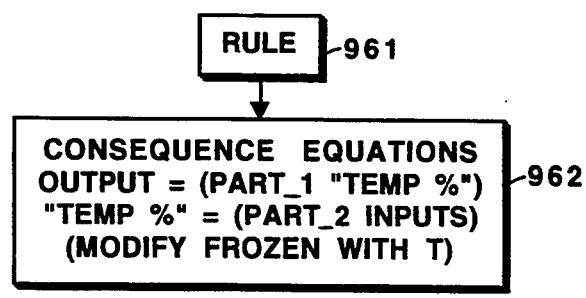
FIG. 9 shows the use of localized signal names between equation statements and the use of the 'modify' command statement for insertion of data base attributes relative to newly inserted model instances.

Referring next to FIG. 9, a rule 961 with separate consequence statements 962, which can achieve the same result as the "nested" equation of FIG. 8 is shown. In this case, the rule creator or writer provides a local signal name "temp %" 962 as an input to PART_1 and an output of PART_2. The '%' character in the name identifies it as a local name. At insertion time, the name "temp %" is appended to a unique substring so that the resulting signal name is unique globally in the entire circuit design. In this case, "temp %" may be transformed to "xxtemp %" to accomplish the role of electrical coupling in the same manner as the signal "xx %" of FIG. 8. This method gives a human rule writer some control over the naming and possibly the meaning of the new signal 849. The insertion also permits the the use of the 'MODIFY' command statement to set parameters relative to the instance just inserted by the previous equation statement. In this example, the statement (modify frozen with 'true') will set the frozen parameter 860 of model instance 846, inserted by the equation statement 962, "temp %=(part_2 inputs). Groups of input or output access forms in equation statements in a rule are treated as sets of signals or evaluated signals.

Figure 10:
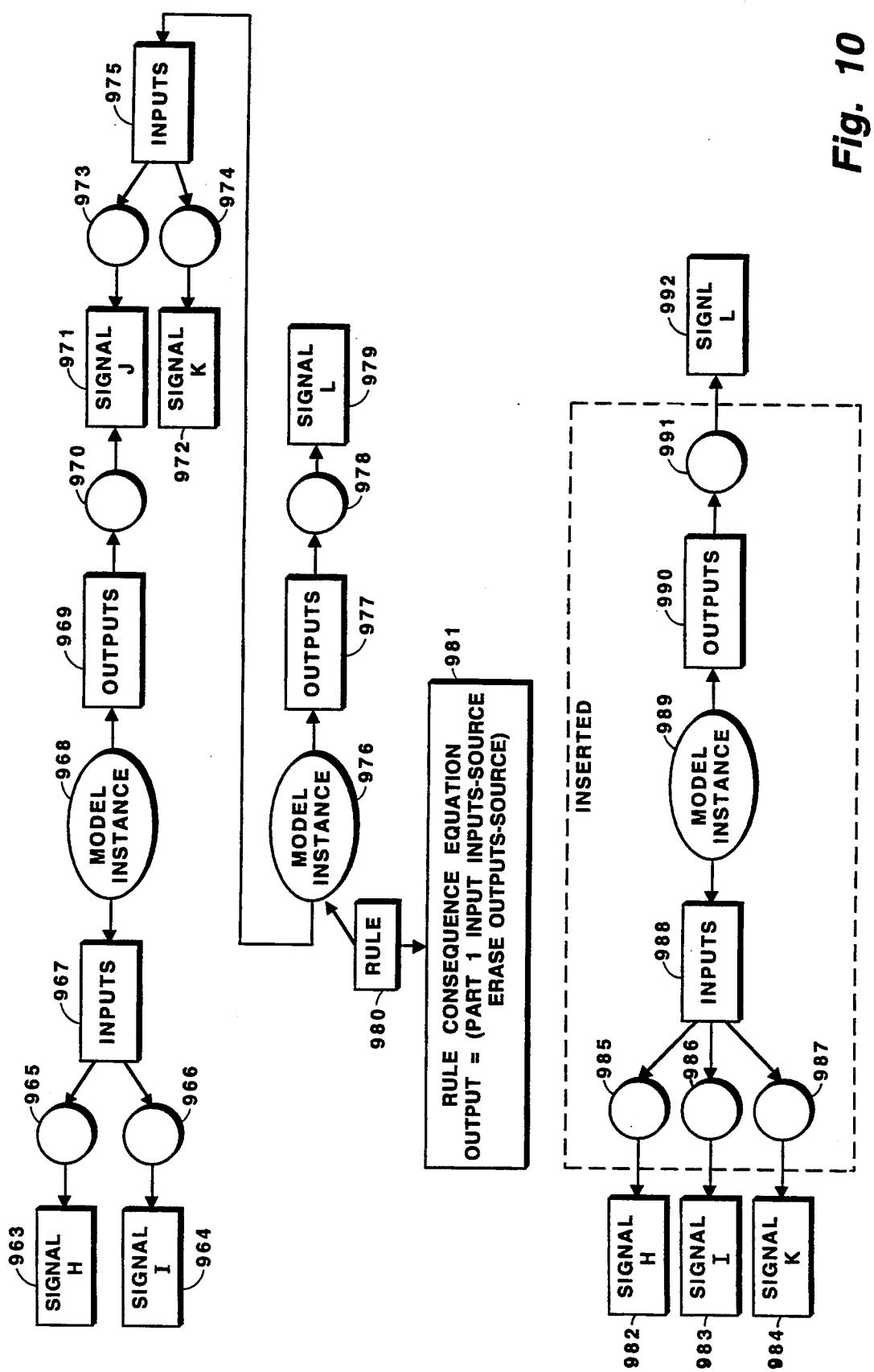
FIG. 10 illustrates the use of the 'ERASE' keyword in an equation access name in a circuit design synthesis procedure.

The signal of selected port instance objects can be "erased" from a set of equation signals through the use of the 'ERASE' keyword, as shown in FIG. 10. A rule 980 is interpreted against a current model instance 976. A source instance 968 is connected through the path 969, 970, 971, 973 and 975 to the current instance 976. The equation 981 indicates the creation of a new instance 989 with inputs connected to the signals of the inputs of the current instance, 'J' and 'K', and the signals of the inputs of the sources 968 of the current instance, 'H' and 'I', but not the signals 'J' of the outputs of the sources 968 of the current instance. This is interpreted to be the set ('H' 'I' 'J' 'K') without 'J', producing the set ('H' 'I' 'K'). A new instance 989 is therefore created with input connections to the signals 982, 983 and 984. The signals 982, 983 and 984 are the same as 963, 964 and 972 with now one additional load on each signal structure after the insertion of instance 989 and its inputs 988, 985, 986 and 987.

Figure 11:
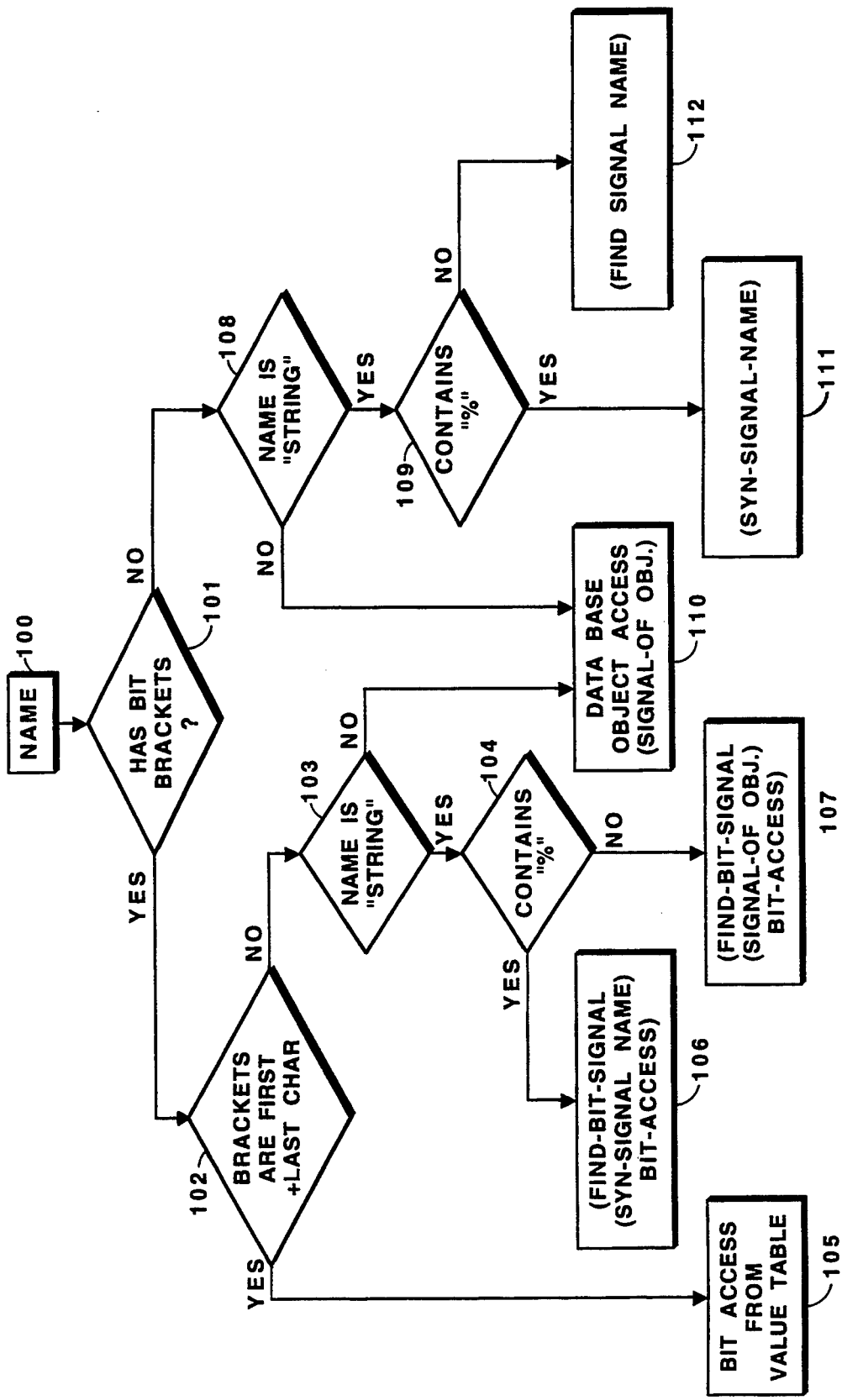
FIG. 11 is a diagram of the algorithm for compiling the signal access at rule compilation time in a circuit synthesis procedure.

Referring next to FIG. 11, the flowchart of the access to the signals as specified by the equations is illustrated. An input form which is from the second, third, etc., items of an equation's right side starts as a name 100. The name may have brackets < > identifying access to a significant bit of the prospective signal, in which case control follows decision 101 to 102. If the name consists only of a bit position access, an appropriate access expression is generated in step 105, (cf U.S. Patent Application "Bitwise Implementation Mechanism for a Circuit Design Synthesis Procedure", cited supra). If the name is not a string 103 and 108, it is assumed to be an access to a port instance object, and the data base access for the signal of the object is generated 110 as described in the U.S. Patent Application "Data Base Access Mechanism for Rules Utilized by a Synthesis Procedure for Logic Circuit Design". If the name has bit brackets, is a string, and contains the character '%' 104, an expression is generated to find a bit significant signal of a local name with bit access 106. If the name has bit brackets, is a string, and does not contain the character '%', an expression is generated to find a bit significant signal of an accessed object with bit access 107. If the name does not have brackets, is a string, and contains the character '%' 109, an expression is generated to create a local signal whose name is derived from this name 111. If the name does not have brackets, is a string, and does not contain '%', an expression is generated to find a global signal by this name 112.

Figure 12:
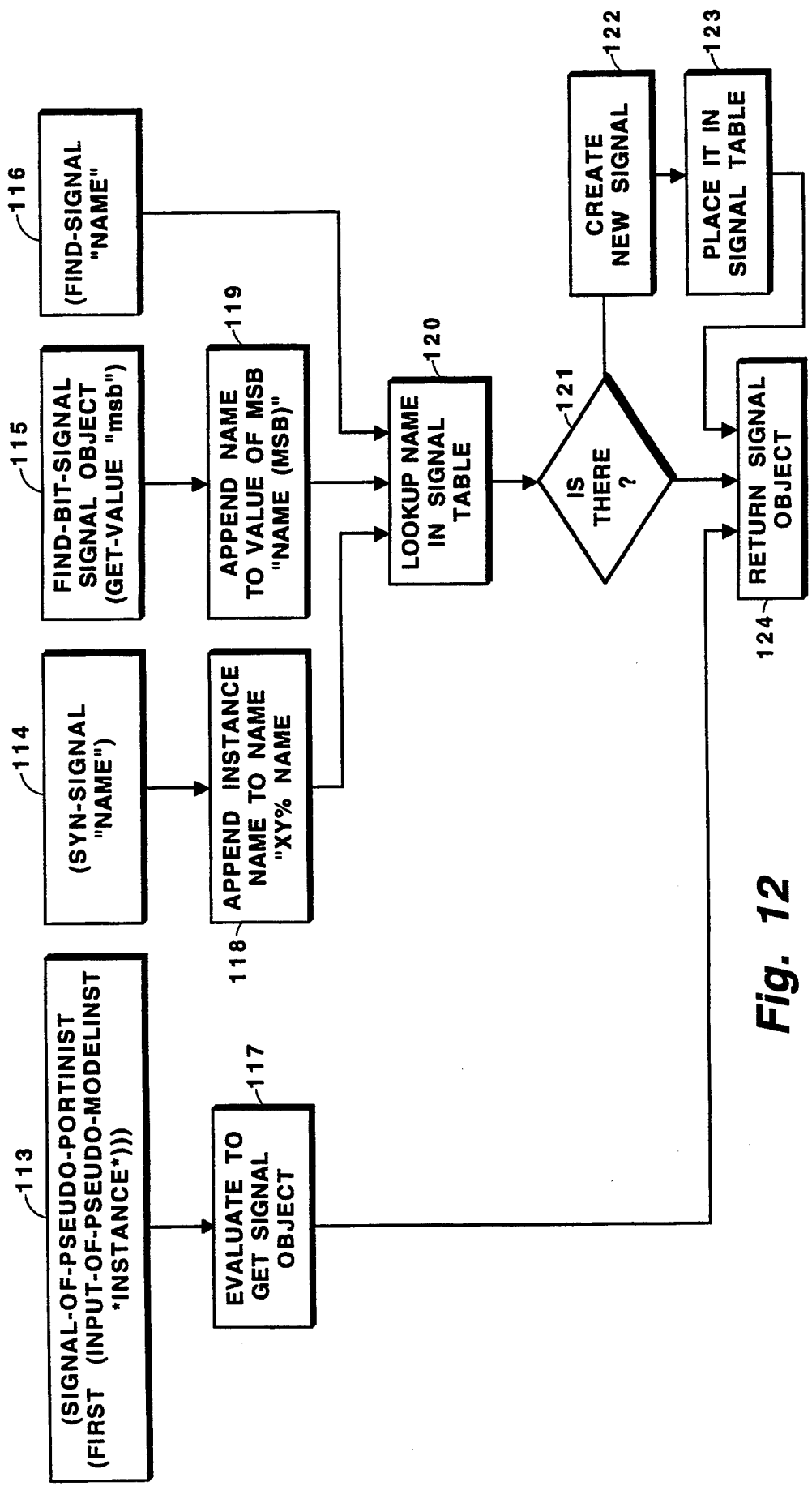
FIG. 12 is a diagram of the algorithm for interpreting signal access at logic synthesis run time in a circuit design synthesis procedure.

Referring next to FIG. 12, the algorithm for interpretation of the signal access expressions is shown. Four types of signal access expressions exist. First, access of an existing signal relative to the current instance 113 is merely evaluated 117 to obtain the desired signal in the data base 124. The other three methods derive a signal name and look for the signal in a table of all the signals in the current model 120. If the signal is there, it is returned 124, otherwise a new signal 122 is created, placed in the signal table 123, and returned 124. The function 'find_signal' 116 uses the name as provided. The function 'syn-signal' 114 appends a local substring to the name to make this signal name unique to this rule and to the current design model. The function 'find-bit-signal' 115 can use any of the other three methods 113, 115 and 116 to obtain a root signal name, then obtains the value of the significant bit, and appends that in brackets '<bit>' at the end of the name.

2. Operation of the Preferred Embodiment

In the present invention, signal names or data base objects representing signal names are ordered in the order that they appear in the schematic drawing of the model object. The procedure assumes that inputs are drawn at the top, left or bottom of the symbol, with counter-clockwise ordering. The procedure also assumes that outputs are drawn at the top, right or bottom of the symbol, with clockwise ordering. Most schematic symbols have inputs only on the left side and outputs only on their right side. It is a simple matter to derive the model definition ordering from the drawing coordinates of the symbol. Because other CAD tools generally format pins of instances randomly by pin name/signal name match up, it is possible to sort the pins of instances from these tools into the model definition order when an interface to such tools occurs.

The rule writer in this invention, when specifying a structural part of the operator to be inserted, need only name the part and signals to be coupled thereto in their drawing shape order. The basic equation format is similar to the software programming language ALGOL and uses nesting and function prefix notation similar to the programming language LISP. Simple LISP functions have the syntax:

(<function-name> <argument> <argument>. . . ) where <function-name> refers to a LISP procedure name and <argument> is the name of a variable value passed to the procedure at its start. In this invention, the syntax for expressing logical connectivity has the form: (<output> <output>. . . )=(<part-name> <input> <input>. . . ).

The foregoing equation format of this invention, while similar to some high-level programming languages in form, has an entirely different meaning and purpose. The equation format is used to describe the structural form of logic design data base objects and also their connectivity to one another.

The format is used in the rule consequence to insert new model instance objects into a current design model. The format can also be used to add or modify attributes of any data base to the instances being inserted. The basic equation in the rule consequence form is: <output-form>=(<model name> <input-form> <input-form>. . . ) where: <output-form> can be a signal name, a list of signal names, a data base access to a pin, or a data base access to a group of pins. <input-form> can be a signal name, a list of signal names, a data base access to a pin, or a data base access to a group of pins, or another (<model-name> <input-form> <input-form>. . . ) in a LISP-like nest. <model-name> can be the name of a model definition which defines the functional, interface, size and other characteristics of either an abstract function or a technology part type.

Separate rules can insert model instances with common signal names between them. A signal name in the insertion equation of one rule matching a signal name in the insertion equation of another rule implies electrical connectivity. When the input-forms or output-forms are interpreted, if the form indicated a port instance object, the signal of the accessed object is retrieved and used to connect to the interface model instance. If the form indicated a signal name to begin with, the name is looked up in a signal table. If it exists in that table, then the signal object pointed to by the table is retrieved and used. If the signal does not exist in the signal table, then a new signal is created, put in the signal table and used to connect to the interface port instances of the model instance at model instance creation time. Thus, fast access to existing signal objects is made possible.

If the input form is nested, unique signal names are generated at rule interpretation time for the connectivity between the operators in the nest this unnesting procedure is done only for the case of an single output.

More than one equation statement per rule is allowed. Signal names which are doubly quoted strings without a % special character are considered global to the current model definition. Signal names which are doubly quoted and have a % special character are considered local to the current model instance at rule interpretation time. An instance name is appended to the local signals defined in the equation in order to preserve their connectivity only within the instances generated by this rule which will be interpreted against a specific model instance.

Input forms which are common to equation statements of the same rule are made non-redundant, so that duplicate instances do not get inserted into the data base. Because the logical negation "NOT" operator is so common, a check of the model instances of the current model definition is made at instance creation time. If a "NOT" model instance with the retrieved input signal does not exist in the current design, then a new "NOT" as defined in the equation is created. If one already exists, connectivity is merely made to the output signal signal of the existing "NOT" model instance.

For each model instance creation, first the object interface form of model instance, port instances, and signal is generated. Then the full logic design data base pointers are installed as described in the U.S. Patent Application entitled "Procedure and Data structure for Synthesis and Transformation of Logic Circuit Designs" cited above.

Following any equation insertion statement, a 'MODIFY' command can be inserted to set data base attributes relative to the new instance, as described in the U.S. Patent Application entitled "Rule Structure for Synthesis of Logic Circuit Design", cited above.

A data base access 'ERASE' keyword can be prepended to the name of a port instance object in an equation, indicating that the signal object at rule interpretation time is to be removed from the group of retrieved input or output signals at instance interface time.

The foregoing description is included to illustrate the preferred embodiment and is not meant to limit the scope of the invention. The scope of the invention is to be limited only by the following claims. From the foregoing description, many variations will be apparent to one skilled in the art that would yet be encompassed by the spirit and scope of the invention.

What is claimed is:

1. A circuit design synthesis process performed by a data processing system having a memory with rules having an antecedent portion and a consequence portion and circuit model instances stored in the memory, said process comprising the steps, performed by the data processing system, of:

determining, by the data processing system, when a predetermined condition in said antecedent portion of a rule associated with a current circuit model instance and stored in said memory is satisfied; and synthesizing a circuit design by implementing, by the data processing system, said consequence portion of said rule stored in said memory when said predetermined condition is present, said consequence rule portion using a form (outputs . . . )=(operation inputs . . . ) when one of a replace, delete, and insert operation is to be performed on said current circuit model instance, and where said outputs and inputs each comprise one of signal names and memory accesses to pins of said current model instance.

2. The circuit design synthesis process according to claim 1, the consequence rule portion including a command including a nested equation, and the process further comprising the step of performing one of the replace, delete, and insertion operations in accordance with the nested equation in the command.

3. The synthesis process of claim 1 wherein an equation format contained in said consequence portion includes circuit model instances, port instances and circuit model signals identifiers.

4. The synthesis process of claim 3 further including the step of storing signed identifiers in a temporary storage location in a said memory of said data processing sytem.

5. A process performed by a data processing system having a memory for synthesis of a circuit design, the process comprising the steps, performed by the data processing system, of:

utilizing, by the data processing system, rules stored in said memory of said data processing system, said rules having an antecedent portion and a consequence portion; and synthesizing a circuit design by inserting, by the data processing system, model instances into a logic design data base stored in said memory of said system according to a rule associated with each current model instance, and connectivity for each model instance having at least one of an input and an output, said inserting being performed in accordance with an equation format contained in said consequence portion, said equation format defining one of input and output signals or memory accesses to pins of each current model instance.

6. A data processing system for performing a circuit design synthesis process, the data processing system having a memory, with rules having an antecedent portion and a consequence portion and circuit model instances stored in the memory, the system including:

means for determining when a predetermined condition in said antecedent portion of a rule associated with a current circuit model instance and stored in said memory is satisfied; and means for synthesizing a circuit design by implementing said consequence portion of said rule stored in said memory when said predetermined condition is present, said consequence rule portion using a form (outputs . . . )=(operation inputs . . . ) when one of a replace, delete, and insert operation is to be performed on said current circuit model instance, and where said outputs and inputs each comprise one of signal names and memory accesses to pins of said current model instance.

7. The system of claim 6, wherein an equation format contained in said consequence portion includes circuit model instances, port instances, and circuit model signal identifiers.

8. The system of claim 7, further including means for storing signed identifiers in a temporary storage location in said memory of said data processing system.

9. The system according to claim 6, the consequence rule portion including a command including a nested equation, and the system further comprising means for performing one of the replace, delete, and insertion operations in accordance with the nested equation in the command.

10. A data processing system, for performing synthesis of a circuit design, having a memory, the system comprising:

means for utilizing rules stored in said memory of said data processing system, said rules having an antecedent portion and a consequence portion; and means for synthesizing a circuit design by inserting model instances into a logic design data base stored in said memory of said system according to a rule associated with each current model instance, and connectivity for each model instance having at least one of an input and an output, said synthesizing means inserting the model instances in accordance with an equation format contained in said consequence portion, said equation format defining one of input and output signals or memory accesses to pins of each current model instance.

11. A circuit design synthesis process performed by a data processing system having a memory in which a plurality of rules and a circuit representation including a plurality of interconnected model instances are stored, each of the rules having an antecedent portion and a consequence portion which contains a command, the process comprising the steps, performed by the data processing system, of:

determining, by the data processing system, whether the antecedent portion of a first one of the plurality of rules is true with respect to a first one of the plurality of model instances;

implementing, by the data processing system, when the antecedent portion of the first rule is determined to be true, the command in the consequence portion of the first rule by determining a boundary of a first subset of the circuit representation and replacing the first subset with a second subset to perform synthesis of a circuit design, the boundary of the first subset being identified by the command in the consequence portion of the first rule.

12. The process according to claim 11, wherein the boundary of the first subset includes a plurality of port instances.

13. The process according to claim 11, wherein the command in the consequence portion of the first rule further identifies a boundary of the second subset and model instances included in the first and second subsets.

14. The process according to claim 11, wherein the first subset includes a plurality of model instances and the second subset includes only a single model instance.

15. The process according to claim 11, wherein the first subset includes only a single model instance and the second subset includes a plurality of model instances.

16. The process according to claim 11, wherein the first subset includes only a single model instance and the second subset includes only a single model instance.

17. The process according to claim 11, wherein the first subset includes a plurality of model instances and the second subset includes a plurality of model instances.

18. A data processing system for performing a circuit design synthesis process, the data processing system having a memory in which a plurality of rules and a circuit representation including a plurality of interconnected model instances are stored, each of the rules having an antecedent portion and a consequence portion which contains a command, the system comprising:

means for determining whether the antecedent portion of a first one of the plurality of rules is true with respect to a first one of the plurality of model instances;

means for implementing, when the antecedent portion of the first rule is determined to be true, the command in the consequence portion of the first rule by determining a boundary of a first subset of the circuit representation and replacing the first subset with a second subset to perform synthesis of a circuit design, the boundary of the first subset being identified by the command in the consequence portion of the first rule.

19. The process according to claim 18, wherein the boundary of the first subset includes a plurality of port instances.

20. The system according to claim 18, wherein the command in the consequence portion of the first rule further identifies a boundary of the second subset and model instances included in the first and second subsets.

21. The system according to claim 18, wherein the first subset includes a plurality of model instances and the second subset includes only a single model instance.

22. The process according to claim 18, wherein the first subset includes only a single model instance and the second subset includes a plurality of model instances.

23. The process according to claim 18, wherein the first subset includes only a single model instance and the second subset includes only a single model instance.

24. The process according to claim 18, wherein the first subset includes a plurality of model instances and the second subset includes a plurality of model instances.

25. In a data processing system for performing a circuit design synthesis process, the data processing system having a memory in which a plurality of rules, and a circuit representation including a plurality of model instances and a plurality of signal representations, are stored, each of the rules having an antecedent portion and a consequence portion, a method comprising the steps, performed by the data processing system, of:

analyzing, by the data processing system, whether the consequence portion of a selected one of the plurality of rules includes an expression that includes a signal representation name, and when the expression does include a signal representation name, determining whether the signal representation name is local to the selected rule;

appending, by the data processing system, a substring to the signal representation name, when the signal representation name is local to the selected rule, in order to form a modified signal representation name, the substring being unique to the selected rule; and accessing, by the data processing system, a signal representation stored in the memory that corresponds to the modified signal representation name in accordance with the expression in the consequence portion of the selected rule to perform synthesis of a circuit design.

26. The method according to claim 25, wherein the signal representation is a bit signal representation representing a bit in a multi-bit signal, and the bit signal representation is identified by a term in the expression.

27. The method according to claim 25, wherein the accessing step includes:

looking up the modified signal representation name in a signal table stored in the memory in order to determine whether the modified signal representation name exists in the signal table;

accessing, when the modified signal representation name exists in the signal table, the signal representation stored in the memory that corresponds to the modified signal representation name.

28. The method according to claim 25, wherein the accessing step includes:

looking up the modified signal representation name in a signal table stored in the memory in order to determine whether the modified signal representation name exists in the signal table;

creating, when the modified signal representation name does not exist in the signal table, a new signal name, placing the new signal name in the signal table, and accessing the signal representation stored in the memory that corresponds to the new signal name.

29. The method according to claim 25, the circuit representation further including a plurality of port instances, and the method further comprising the step of:
indirectly accessing the signal representation stored in the memory, when the expression for accessing the signal representation does not include a signal representation name, by way of a port instance identified by the expression.

30. A data processing system for performing a circuit design synthesis process and a signal representation access method used in the performing of the circuit design synthesis process, the data processing system having a memory in which a plurality of rules, and a circuit representation including a plurality of model instances and a plurality of signal representations, are stored, each of the rules having an antecedent portion and a consequence portion, the system comprising:
means for analyzing whether the consequence portion of a selected one of the plurality of rules includes an expression that includes a signal representation name, and when the expression does include a signal representation name, determining whether the signal representation name is local to the selected rule;
means for appending a substring to the signal representation name, when the signal representation name is local to the selected rule, in order to form a modified signal representation name, the substring being unique to the selected rule; and
means for accessing a signal representation stored in the memory that corresponds to the modified signal representation name in accordance with the expression in the consequence portion of the selected rule to perform synthesis of a circuit design.

31. The method according to claim 30, wherein the signal representation is a bit signal representation representing a bit in a multi-bit signal, and the bit signal representation is identified by a term in the expression.

32. The system according to claim 30, wherein the accessing means includes:
means for looking up the modified signal representation name in a signal table stored in the memory in order to determine whether the modified signal representation name exists in the signal table;
means for accessing, when the modified signal representation name exists in the signal table, the signal representation stored in the memory that corresponds to the modified signal representation name.

33. The method according to claim 30, wherein the accessing means includes:
means for looking up the modified signal representation name in a signal table stored in the memory in order to determine whether the modified signal representation name exists in the signal table;
means for creating, when the modified signal representation name does not exist in the signal table, a new signal name, placing the new signal name in the signal table, and accessing the signal representation stored in the memory that corresponds to the new signal name.

34. The system according to claim 30, the circuit representation further including a plurality of port instances, and the system further comprising:
means for indirectly accessing the signal representation stored in the memory, when the expression for accessing the signal representation does not include a signal representation name, by way of a port instance identified by the expression.

35. In a data processing system performing a circuit design synthesis process, the data processing system having a memory in which a circuit representation including a plurality of model instances and a plurality of signal representations is stored, a method of generating a plurality of executable rules, from a plurality of source rules, to be used for modifying the circuit representation, the method comprising the steps, performed by the data processing system, of:
determining, by the data processing system, when a name contained in a source rule inputted to the data processing system is a signal representation name, whether the signal representation name is local to the source rule;
generating, by the data processing system, when the signal representation name is local to the source rule, an expression contained within the executable rule, the expression being used for accessing a signal representation stored in the memory that corresponds to the signal representation name to perform synthesis of a circuit design and including an instruction for appending a substring, unique to the rule, to the signal representation name in order to form a modified signal representation name.

36. The method according to claim 35, further comprising the step of:
generating, when the signal representation is not local to the rule, an expression contained within the executable rule, the expression being used for accessing a signal representation stored in the memory that corresponds to the signal representation name, but not including the substring appending instruction.

37. The method according to claim 35, wherein the accessing of the signal representation includes:
looking up the modified signal representation name in a signal table stored in the memory in order to determine whether the modified signal representation name exists in the signal table;
accessing, when the modified signal representation name exists in the signal table, the signal representation stored in the memory that corresponds to the modified signal representation name.

38. The method according to claim 35, wherein the accessing of the signal representation includes:
looking up the modified signal representation name in a signal table stored in the memory in order to determine whether the modified signal representation name exists in the signal table;
creating, when the modified signal representation name does not exist in the signal table, a new signal name, placing the new signal name in the signal table, and accessing the signal representation stored in the memory that corresponds to the new signal name.

39. The method according to claim 35, the circuit representation further including a plurality of port instances, and the method further comprising the step of:
generating, when the source rule inputted to the data processing system does not contain a signal representation name, an expression in the executable rule for indirectly accessing a signal representation stored in the memory by way of a port instance identified by the expression.

40. The method according to claim 35, wherein the signal representation is a bit signal representation representing a bit in a multi-bit signal, and the bit signal representation is identified by a term in the expression.

41. A data processing system for performing a circuit design synthesis process and for generating a plurality of executable rules, from a plurality of source rules, to be used for modifying a circuit representation stored in a memory of the data processing system, the circuit representation including a plurality of model instances and a plurality of signal representations, the system comprising:
 means for determining, when a name contained in a source rule inputted to the data processing system is a signal representation name, whether the signal representation name is local to the source rule;
 means for generating, when the signal representation name is local to the source rule, an expression contained within the executable rule, the expression being used for accessing a signal representation stored in the memory that corresponds to the signal representation name to perform synthesis of a circuit design and including an instruction for appending a substring, unique to the rule, to the signal representation name in order to form a modified signal representation name.

42. The method according to claim 41, further comprising:
 means for generating, when the signal representation is not local to the rule, an expression contained within the executable rule, the expression being used for accessing a signal representation stored in the memory that corresponds to the signal representation name, but not including the substring appending instruction.

43. The system according to claim 41, wherein the accessing of the signal representation includes:
 looking up the modified signal representation name in a signal table stored in the memory in order to determine whether the modified signal representation name exists in the signal table;
 accessing, when the modified signal representation name exists in the signal table, the signal representation stored in the memory that corresponds to the modified signal representation name.

44. The system according to claim 41, wherein the accessing of the signal representation includes:
 looking up the modified signal representation name in a signal table stored in the memory in order to determine whether the modified signal representation name exists in the signal table;
 creating, when the modified signal representation name does not exist in the signal table, a new signal name, placing the new signal name in the signal table, and accessing the signal representation stored in the memory that corresponds to the new signal name.

45. The system according to claim 41, the circuit representation further including a plurality of port instances, and the system further comprising:
 means for generating, when the source rule inputted to the data processing system does not contain a signal representation name, an expression in the executable rule for indirectly accessing a signal representation stored in the memory by way of a port instance identified by the expression.

46. The system according to claim 41, wherein the signal representation is a bit signal representation representing a bit in a multi-bit signal, and the bit signal representation is identified by a term in the expression.

* * * * *